United States Patent
Hu et al.

(10) Patent No.: US 11,626,859 B2
(45) Date of Patent: Apr. 11, 2023

(54) BEAM GENERATOR, BEAM GENERATING METHOD, AND CHIP

(71) Applicant: Montage LZ Technologies (Chengdu) Co., Ltd., Chengdu (CN)

(72) Inventors: Gang Hu, Chengdu (CN); Taibo Dong, Chengdu (CN); Xuepeng Wang, Chengdu (CN)

(73) Assignee: Montage LZ Technologies (Chengdu) Co., Ltd., Sichuan (CN)

( * ) Notice: Subject to any disclaimer, the term of this patent is extended or adjusted under 35 U.S.C. 154(b) by 0 days.

(21) Appl. No.: 17/684,429

(22) Filed: Mar. 2, 2022

(65) Prior Publication Data

US 2023/0029390 A1 Jan. 26, 2023

(51) Int. Cl.
*H03H 17/02* (2006.01)
*H04S 1/00* (2006.01)

(52) U.S. Cl.
CPC ............ *H03H 17/0294* (2013.01); *H04S 1/00* (2013.01)

(58) Field of Classification Search
None
See application file for complete search history.

(56) References Cited

U.S. PATENT DOCUMENTS

| | | | |
|---|---|---|---|
| 2007/0055505 A1* | 3/2007 | Doclo | G10L 21/0208 704/226 |
| 2014/0044274 A1* | 2/2014 | Ebenezer | H04R 3/005 381/71.4 |
| 2017/0330580 A1* | 11/2017 | Wolff | H04R 3/005 |

* cited by examiner

*Primary Examiner* — Kenny H Truong

(57) ABSTRACT

A beam generator, a beam generating method, and a chip are provided. The beam generator comprises a first channel, a second channel, and a signal merging module; the first channel comprises a first-channel filter, the first-channel filter is used to filter an input signal to obtain a first filtered signal; the first filtered signal comprises a desired signal; the second channel comprises: a second-channel blocking module, used to block the desired signal in the input signal to obtain a blocked signal; a compensation filter, connected to the second-channel blocking module for compensating for the blocked signal to obtain a second filtered signal; and an adaptive filter connected to the compensation filter for adaptively filtering the second filtered signal to obtain a third filtered signal; the signal merging module is for merging the first filtered signal and the third filtered signal to obtain an output signal.

9 Claims, 3 Drawing Sheets

BEAM GENERATOR, BEAM GENERATING METHOD, AND CHIP

CROSS REFERENCE TO RELATED APPLICATION

The present application claims the benefit of priority to Chinese Patent Application No. CN 202110839588X, entitled "BEAM GENERATOR, BEAM GENERATING METHOD, AND CHIP", filed with CNIPA on Jul. 23, 2021, the disclosure of which is incorporated herein by reference in its entirety for all purposes.

FIELD OF TECHNOLOGY

The present disclosure generally relates to a signal processing device, and in particular to a beam generator, a beam generating method, and a chip.

BACKGROUND

Beam generation is a spatial filtering technique that merges data received by each array element based on prior knowledge of an array (such as array shape, array element characteristics, etc.) in order to enhance signals and cancel noise and interference. Linear constraint minimum variance (LCMV) beam generators are commonly used to generate beams. When the direction of arrival (DoA) of a desired signal is known, by imposing certain constraints on array coefficients by LCMV, the desired signal is retained with a specific gain and phase accordingly, while interfering signals arriving from other directions is minimized in the output. Generalized sidelobe cancellers (GSC) are an equivalent implementation of LCMV, which transform the problem of adaptive beam generation into an unconstrained optimization problem. A GSC beam generator contains a main channel and several auxiliary channels, wherein a static weight vector of the main channel falls in the value domain of a constraint matrix and an adaptive weight vector on the auxiliary channel falls in the null space of the constraint matrix. Ideally, the main channel of the GSC beam generator would output only the desired signal, while the auxiliary channel would output only the noise and uncorrelated interference components by blocking the desired signal, and finally achieve interference suppression.

SUMMARY

The present disclosure provides a beam generator, a beam generating method, and a chip.

The beam generator comprises a first channel, a second channel, and a signal merging module; the first channel comprises a first-channel filter, the first-channel filter used to filter an input signal to obtain a first filtered signal; the first filtered signal comprises a desired signal; the second channel comprises: a second-channel blocking module, used to block the desired signal in the input signal to obtain a blocked signal; a compensation filter, connected to the second-channel blocking module for compensating the blocked signal to obtain a second filtered signal; and an adaptive filter connected to the compensation filter for adaptively filtering the second filtered signal to obtain a third filtered signal; the signal merging module is connected to the first-channel filter and the adaptive filter for merging the first filtered signal and the third filtered signal to obtain an output signal.

In one embodiment, the second-channel blocking module blocks the desired signal in the input signal using a blocking matrix, and the compensation filter is used to compensate for zero values in the blocking matrix.

In one embodiment, a transfer function of the compensation filter is obtained from an inverse function of the blocking matrix.

In one embodiment, the transfer function of the compensation filter is the inverse function of the blocking matrix.

In one embodiment, the blocking matrix is $$\begin{bmatrix} 1 & 1 & -1 & -1 \\ 1 & -1 & -1 & 1 \\ 1 & -1 & 1 & -1 \end{bmatrix},$$

and the transfer function of the compensation filter is $$H(z) = \frac{1}{1 - \alpha \times z^{-4}},$$

wherein $\alpha$ is a positive number less than 1.

In one embodiment, the output signal is given by: $e(n) = (w_q^H - w_a^H \times T^H \times B^H) \times x$, wherein, $w_q$ is a weight vector corresponding to the first-channel filter, $w_a$ is a weight vector corresponding to the adaptive filter, T is a weight vector corresponding to the compensation filter, B is the blocking matrix, and x is the input signal.

In one embodiment, the weight vector corresponding to the adaptive filter is given by: $w_a = ((B \times T)^H R_{xx} \times B \times T)^{-1} \times (B \times T)^H \times R_{xx} \times w_q$, wherein $R_{xx}$ is an autocorrelation matrix of the input signal.

The present disclosure also provides a beam generating method, comprising: filtering an input signal by a first-channel filter to obtain a first filtered signal, wherein the first filtered signal comprises a desired signal; blocking the desired signal in the input signal by a second-channel blocking module to obtain a blocked signal; compensating the blocked signal by a compensation filter to obtain a second filtered signal; adaptively filtering the second filtered signal by an adaptive filter to obtain a third filtered signal; and merging the first filtered signal and the third filtered signal to obtain an output signal.

The present disclosure further provides a chip, the chip comprising the beam generator described above.

As described above, the beam generator provided in one or more embodiments of the present disclosure can effectively improve input signal quality of the adaptive filter by providing a compensation filter in the second channel (i.e., the auxiliary channel) to compensate for the blocked signal, thus ensuring that the adaptive filter can obtain a more desirable filter coefficient, and thus the beam generator has a more robust interference suppression capability and a higher output-signal-to-noise ratio.

DETAILED DESCRIPTION

Figure 1:
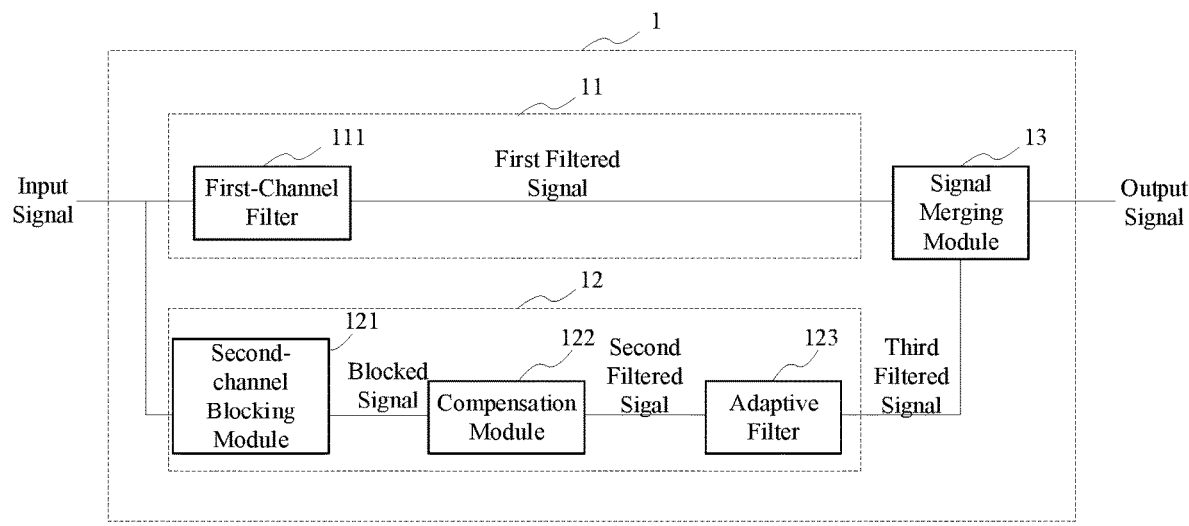
FIG. 1 is a schematic diagram of a structure of a beam generator according to an embodiment of the present disclosure.

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and disclosures without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated. In addition, in this document, relationship terms such as "first", "second", etc. are used only to distinguish one entity or operation from another, and do not necessarily require or imply any such actual relationship or sequence between these entities or operations.

In practice, the performance of a GSC beam generator is limited by a convergence rate and convergence weight of an adaptive process, which makes it difficult to adequately suppress interference and noise components, and may also result in partial cancellation due to leakage of a desired signal into an auxiliary channel, degrading the performance of the GSC beam generator. To address this issue, referring to FIG. 1, an embodiment of the present disclosure provides a beam generator 1, comprising a first channel 11, a second channel 12, and a signal merging module 13.

The first channel 11 comprises a first-channel filter 111 used to filter an input signal to obtain a first filtered signal. The input signal is a signal received by the beam generator 1, comprising a desired signal, interference, and noise; the first-channel filter 111 is mainly used to filter out the interference and noise in the input signal. The first filtered signal comprises mainly the desired signal and may also comprise some interference and noise.

The second channel 12 comprises a second-channel blocking module 121, a compensation filter 122, and an adaptive filter 123. The second-channel blocking module 121 is used to block the desired signal in the input signal to obtain a blocked signal, the blocked signal comprising mainly interference and noise, and, in some embodiments, also part of the desired signal. The compensation filter 122 is connected to the second-channel blocking module 121 for compensatively filtering the blocked signal to obtain a second filtered signal. The adaptive filter 123 is connected to the compensation filter 122 for adaptive filtering of the second filtered signal to minimize the mean square error between the first channel 11 and the second channel 12. The output of the adaptive filter 123 is a third filtered signal, wherein the third filtered signal comprises mainly interference and noise, and may also comprise part of the desired signal in some embodiments. In one embodiment. the first-channel filter 111 is a forward filter, while the compensation filter 122 is a feedback filter.

The signal merging module 13 is connected to the first-channel filter 111 and the adaptive filter 123 for merging the first filtered signal and the third filtered signal to obtain an output signal. The third filtered signal and the first filtered signal are both obtained by processing the input signal, thus the third filtered signal is correlated with the first filtered signal, and therefore the signal merging module 13 can obtain the output signal by merging the first filtered signal and the third filtered signal. For example, the signal merging module 13 can subtract the first filtered signal from the third filtered signal, or vice versa, to obtain the output signal.

According to the above description, it can be seen that since the compensation filter 122 is provided in the second channel 12 to compensatively filter the blocked signal, the quality of the signal input to the adaptive filter 123 can be effectively improved, thus ensuring that the adaptive filter 123 can obtain a more desirable filter coefficient, and thus the beam generator 1 has a more robust interference suppression performance and a higher output-signal-to-noise ratio. In some embodiments, the beam generator 1 is applied to noise-canceling headphones, microphones, hearing aids, or intelligent speech recognition devices, where the beam generator 1 may be accompanied by microphone arrays.

In one embodiment of the present disclosure, the second-channel blocking module 121 adopts a blocking matrix to block the desired signal in the input signal. The compensation filter 122 is used to compensate for the zero values in the blocking matrix, i.e., the compensation filter 122 in the present disclosure is designed in a way that it can compensate for the zero values in the blocking matrix.

In an embodiment, a transfer function of the compensation filter 122 may be obtained from an inverse function of the blocking matrix, wherein the transfer function is selected based on its impact on performance.

In an embodiment, the inverse function of the blocking matrix is the transfer function of the compensation filter 122. For example, a row of the blocking matrix can be selected and a transfer function corresponding to that row can then be accordingly obtained, and the inverse of this transfer function is the transfer function of the compensation filter 122.

In an embodiment, a quadratic uniform linear array (ULA) may be used in the present beam generating system, and if the DoA of the input signal is 0°, then the blocking matrix may be $$\begin{bmatrix} 1 & 1 & -1 & -1 \\ 1 & -1 & -1 & 1 \\ 1 & -1 & 1 & -1 \end{bmatrix},$$

at which point a z-transformation of the transfer function that compensate for the blocking matrix may be given by:

$$H(z) = \frac{1}{1 - \alpha \times z^{-4}},$$

wherein z is a complex variable in the z-transformation, corresponding to the time domain and denoting a delay of a sample, and α is a weighting factor of the compensation filter 122 for stabilizing the transfer function of the compensation filter 122, which takes the value of a positive number less than 1.

Optionally, if the DoA of the input signal is not 0°, assuming that an steering vector of the desired signal is a=[a(1), a(2), . . . , a(M)], the blocking matrix may be $$\begin{bmatrix} 1 & -\frac{a(1)}{a(2)} & 0 & L & 0 \\ 0 & 1 & -\frac{a(2)}{a(3)} & & \\ M & M & M & M & M \\ 0 & 0 & L & 1 & -\frac{a(M-1)}{a(M)} \end{bmatrix},$$

at which point the transfer function of the compensation filter 122 may be obtained from the inverse function of the transfer function, as described above.

In an embodiment of the present disclosure, the output signal is e(n)=($w_q^H - w_a^H \times T^H \times B^H$)×x, wherein $w_q$ is a weight vector corresponding to the first-channel filter 111, $w_a$ is a weight vector corresponding to the adaptive filter 123, T is a weight vector corresponding to the compensation filter 122 (i.e. a finite Taylor series expansion of H(z)), B is the blocking matrix, and x is the input signal.

Under the LCMV criterion, the optimal value of $w_a$ is given by:

$$w_a = \arg\min_{w_a}[w_q - B \times T \times w_a]^H \times R_{xx} \times [w_q - B \times T \times w_a] =$$

$$\left((B \times T)^H \times R_{xx} \times B \times T\right)^{-1} (B \times T)^H R_{xx} \times w_q,$$

wherein $R_{xx}$ is an autocorrelation matrix of the input signal. Since the autocorrelation matrix $R_{xx}$ of the input signal is difficult to obtain in advance and inverse operations of matrices are more complicated, the least mean square (LMS) algorithm is often used in practice to calculate adaptively the weight vector $w_a$ corresponding to the adaptive filter 123. According to the adaptive filtering theory, the convergence speed and numerical stability of the LMS algorithm are determined by a condition number of the corresponding matrix (($B \times T)^H \times R_{xx} \times B \times T)^{-1}(B \times T)^H R_{xx} \times w_q$, and the smaller the condition number, the faster the LMS algorithm converges and the higher the numerical stability of the algorithm is.

Figure 2:
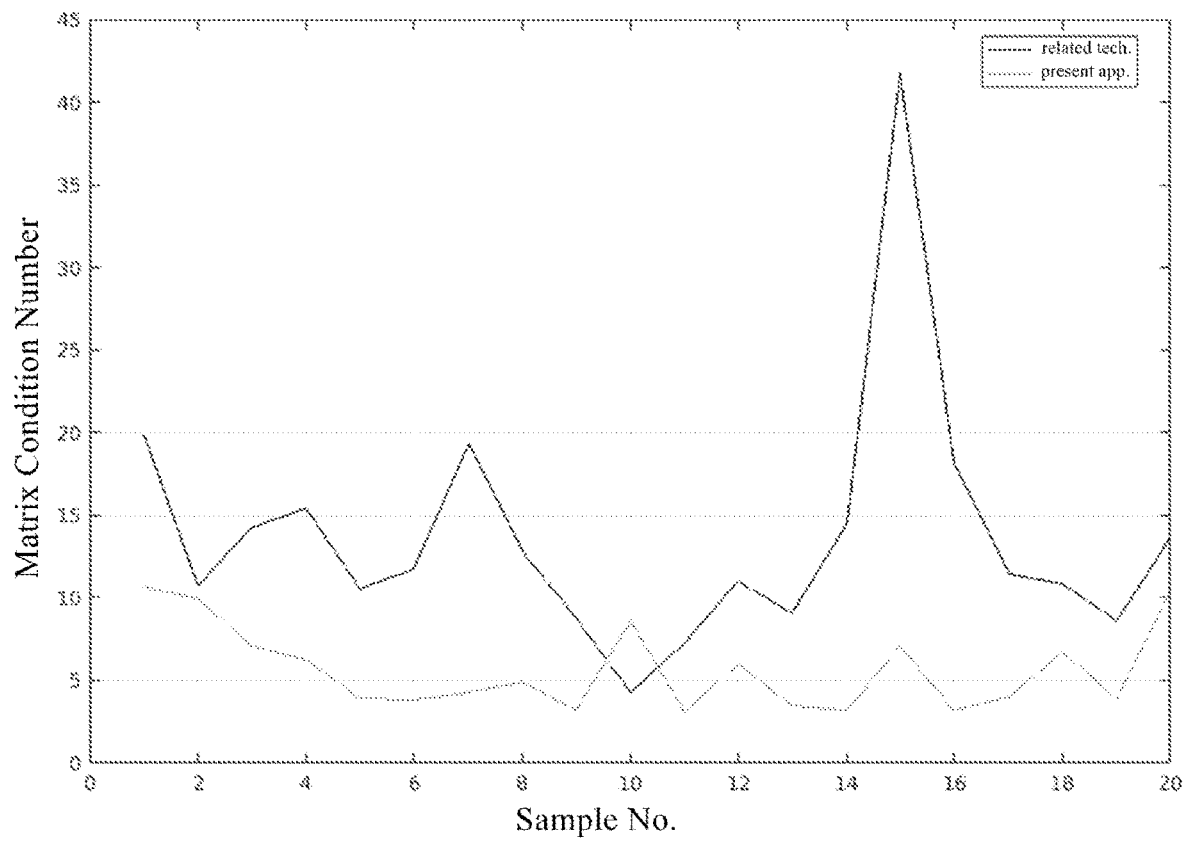
FIG. 2 shows an example of simulation results of a beam generator according to an embodiment of the present disclosure.

In one embodiment, the compensation filter 122 is cascaded after the second-channel blocking module 121, which can significantly decrease the condition number of the above matrix, thus achieving fast convergence of the weight vector corresponding to the adaptive filter 123. For example, see FIG. 2, which shows the condition number of the autocorrelation matrix of the input signal of the adaptive filter 123 of the present disclosure, and the condition number of an autocorrelation matrix of an input signal of an adaptive filter in the related art when no compensation filter is used. In comparison, it can be seen that the autocorrelation matrix condition number of the input signal of the adaptive filter 123 of the present disclosure is generally smaller than the one in the prior art, which means the present disclosure can achieve faster convergence of the weight vector corresponding to the adaptive filter and has good numerical stability.

Figure 3:
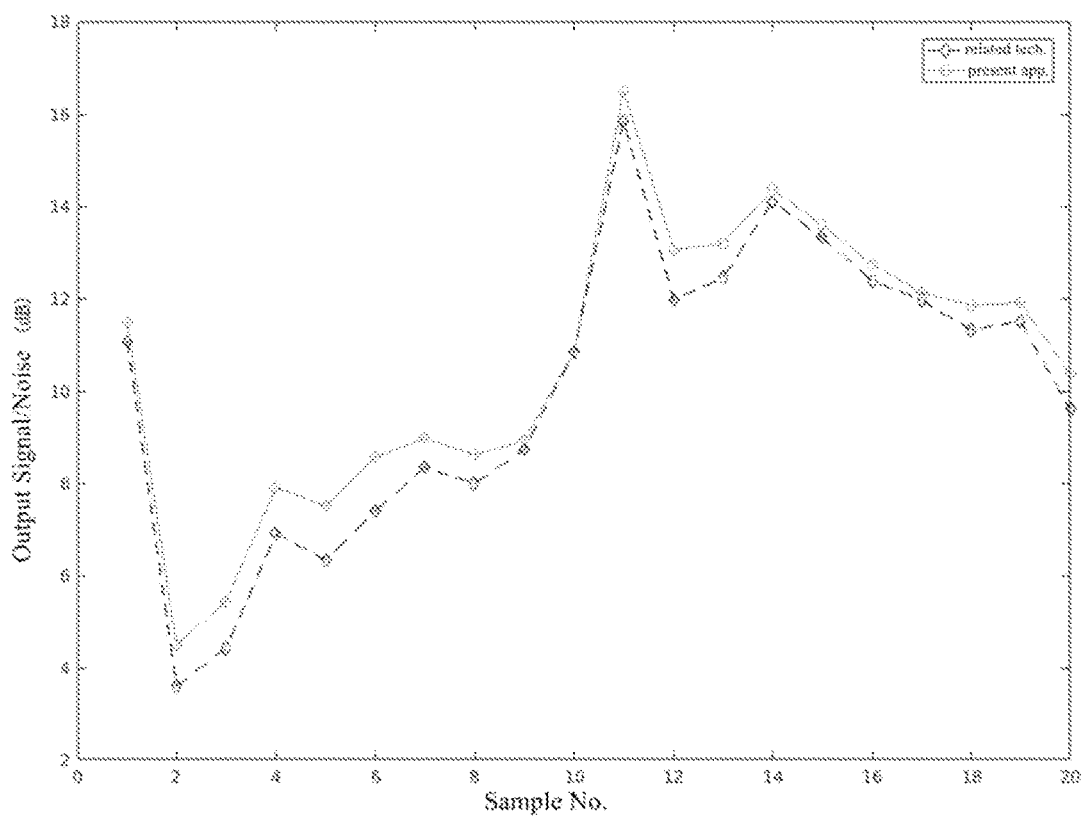
FIG. 3 shows an example of simulation results of a beam generator according to an embodiment of the present disclosure.

In addition, the fact that the compensation filter 122 of the present disclosure is cascaded after the second-channel blocking module 121 improves the output-signal-to-noise ratio of the beam generator 1. For example, see FIG. 3, which shows the output-signal-to-noise ratio of the adaptive filter 123 of the present disclosure, as well as the one in the related art with no compensation filter. In comparison, it can be seen that the beam generator 1 in the present disclosure has a higher output-signal-to-noise ratio.

Figure 4:
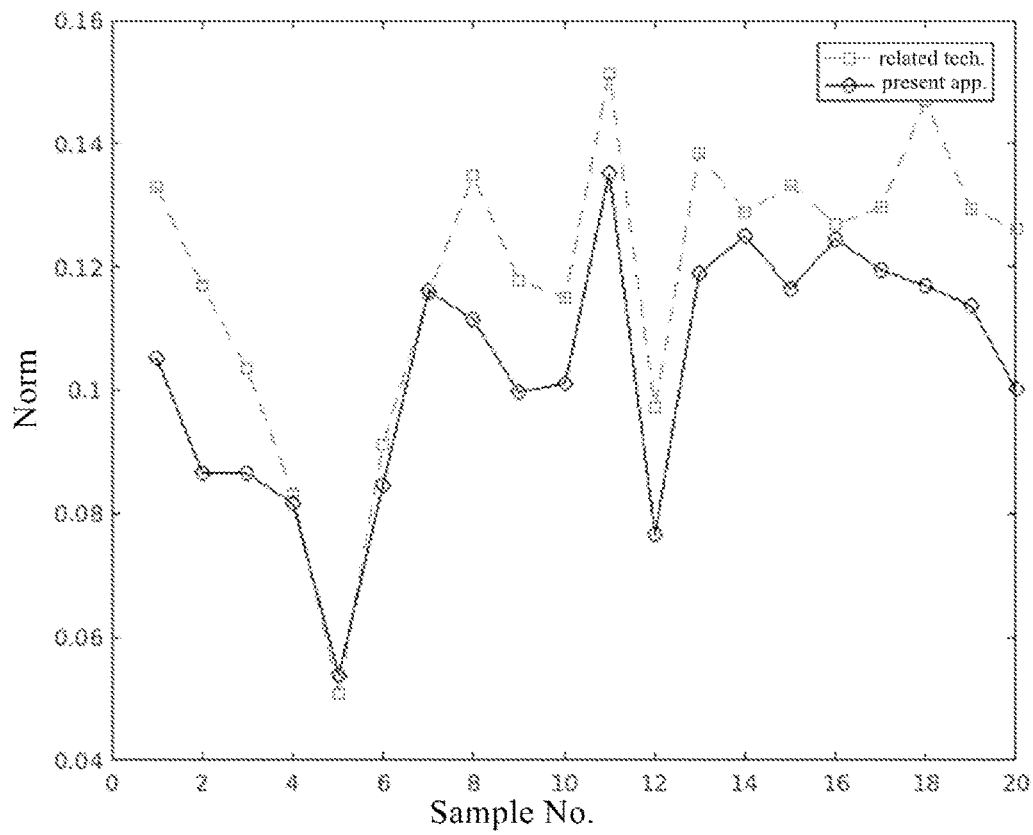
FIG. 4 shows an example of simulation results of a beam generator according to an embodiment of the present disclosure.

Further, the fact that the compensation filter 122 of the present disclosure is cascaded after the second-channel blocking module 121 decreases the norm of the weight vector $w_a$ corresponding to the adaptive filter 123. For example, see FIG. 4, which shows a norm of the weight vector $w_a$ for the present disclosure and a norm of a weight vector corresponding to an adaptive filter in the related art with no compensation filter. The smaller the norm of the weight vector $w_a$, the more robust the beam generator 1, and therefore, the beam generator 1 of the present disclosure has a higher robustness.

Therefore, it can be seen that the beam generator 1 according to the present disclosure has a higher robustness, its output signal has a higher signal-to-noise ratio, and the adaptive filter 123 in the beam generator 1 has better convergence compared to the related art.

Figure 5:
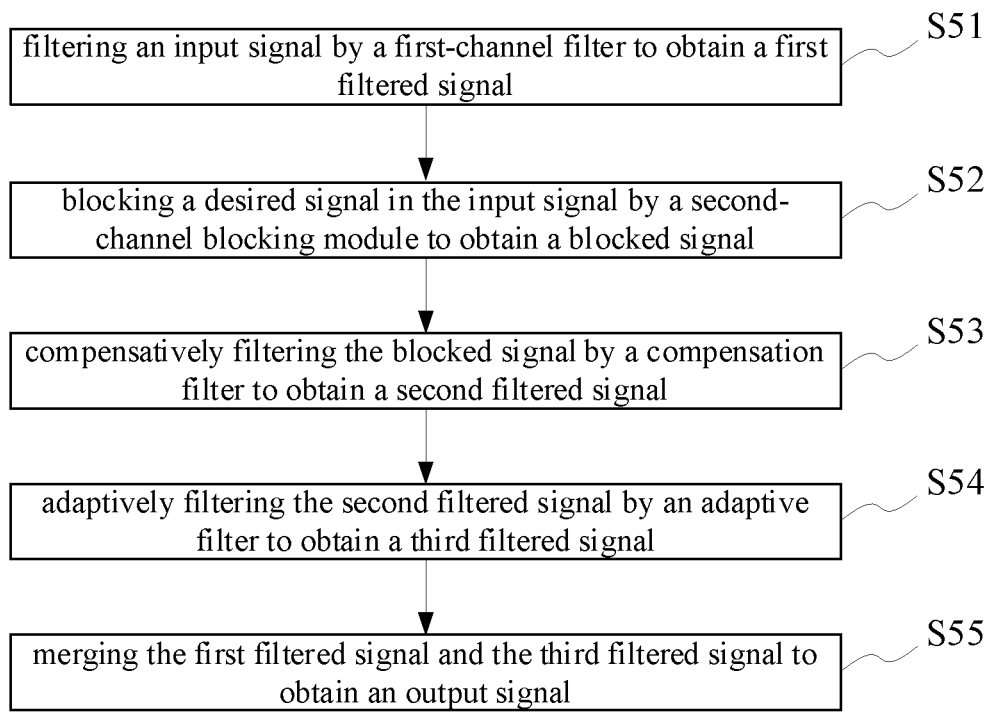
FIG. 5 is a flowchart illustrating a beam generating method according to an embodiment of the present disclosure.

Based on the above description of the beam generator 1, the present disclosure also provides a beam generating method. Specifically, referring to FIG. 5, in an embodiment of the present disclosure, the beam generating method comprises.

S51, filtering an input signal by a first-channel filter to obtain a first filtered signal, the first filtered signal comprising a desired signal.

S52, blocking the desired signal in the input signal by a second-channel blocking module to obtain a blocked signal;

S53, compensatively filtering the blocked signal by a compensation filter to obtain a second filtered signal;

S54, adaptively filtering the second filtered signal by an adaptive filter to obtain a third filtered signal; and S55, merging the first filtered signal and the third filtered signal to obtain an output signal.

The above steps S51 to S55 may correspond to the corresponding modules or parts in the beam generator 1 shown in FIG. 1.

It should be noted that the symbols S51 to S55 are only used to identify the specific steps, not to limit the order of execution of each step.

Figure 6:
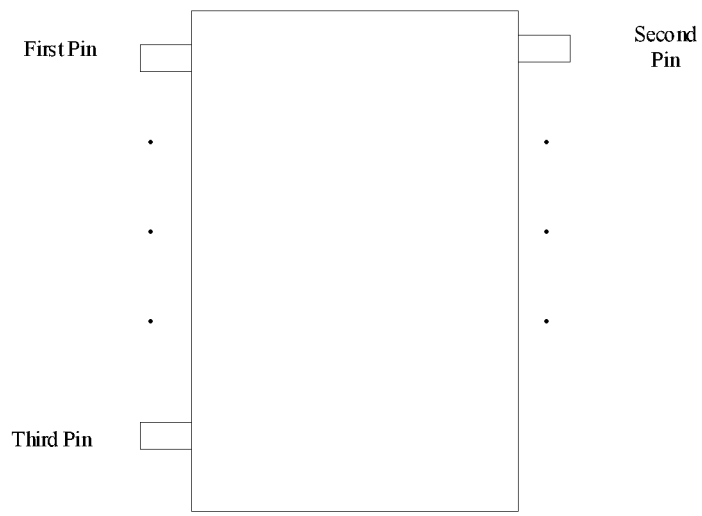
FIG. 6 shows a structure of a chip according to an embodiment of the present disclosure.

Based on the above description of the beam generator, the present disclosure also provides a chip. Referring to FIG. 6, in an embodiment of the present disclosure, the chip comprises the beam generator 1 shown in FIG. 1. Specifically, the chip comprises at least part of the beam generator 1. For example, the chip may comprise the entire beam generator 1, or it may comprise only the first-channel filter 111 and/or the second-channel blocking module 121 of the beam generator 1. The chip may be represented as a saleable active device made by packaging a beam generator 1 fabricated on a wafer using semiconductor technology; or as a saleable active device made by packaging the beam generator 1 using printed circuit board packaging technology.

In summary, the present disclosure provides a robust beam generator in which the beam generator is provided with a compensation filter in a second channel to process a blocked signal, and the compensation filter is designed in such a way that it is capable of compensating for zero values in a blocking matrix, which improves the quality of an input signal to an adaptive filter in the beam generator, thus ensuring that the adaptive filter obtains a more robust filter coefficient with better interference rejection. Moreover, designing the adaptive filter under the principle of compensating for the zero values in the blocking matrix has advantages such as simplicity of implementation. Therefore, the present disclosure effectively overcomes various shortcomings of the prior art and has a high industrial value.

It needs to be noted that it should be understood that the division of modules of the beam generator is only a logical function division, and the modules can be fully or partially integrated into a physical entity or physically separated in the actual implementation. In one embodiment, these modules can all be implemented in the form of software called by processing components. In one embodiment, they can also be all implemented in the form of hardware. In one embodiment, some of the modules can also be realized in the form of software called by processing components, and some of the module can be realized in the form of hardware. For example, a certain module may be a separate processing component, or it may be integrated into a chip of the device, or it may be stored in the memory of the device in the form of codes, and the function of the module may be performed by a processing component of the device. In addition, all or part of these modules can be integrated together, or can be implemented independently. The processing component may be an integrated circuit capable of processing signals. In the implementation process, each step or each module herein can be implemented by hardware integrated logic circuits or software instructions in the processing component.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A beam generator, comprising a first channel, a second channel, and a signal merging module, wherein:
the first channel comprises a first-channel filter, the first-channel filter filters an input signal to obtain a first filtered signal, and the first filtered signal comprises a desired signal;
the second channel comprises:
a second-channel blocking module for blocking the desired signal in the input signal to obtain a blocked signal,
a compensation filter, connected to the second-channel blocking module, for compensatively filtering the blocked signal to obtain a second filtered signal, and
an adaptive filter, connected to the compensation filter, for adaptively filtering the second filtered signal to obtain a third filtered signal;
wherein the signal merging module is connected to the first-channel filter and the adaptive filter for merging the first filtered signal and the third filtered signal to obtain an output signal.

2. The beam generator according to claim 1, wherein the second-channel blocking module blocks the desired signal in the input signal using a blocking matrix and the compensation filter is used to compensate for zero values in the blocking matrix.

3. The beam generator according to claim 2, wherein a transfer function of the compensation filter is obtained from an inverse function of the blocking matrix.

4. The beam generator according to claim 3, wherein the transfer function of the compensation filter is the inverse function of the blocking matrix.

5. The beam generator according to claim 4, wherein the blocking matrix is $$\begin{bmatrix} 1 & 1 & -1 & -1 \\ 1 & -1 & -1 & 1 \\ 1 & -1 & 1 & -1 \end{bmatrix}$$

and the transfer function of the compensation filter is $$H(z) = \frac{1}{1 - \alpha \times z^{-4}},$$

wherein $\alpha$ is a positive number less than 1.

6. The beam generator according to claim 2, wherein the output signal is: $e(n)=(w_q^H - w_a^H \times T^H \times B^H) \times x$, wherein, $w_q$ is a weight vector corresponding to the first-channel filter, $w_a$ is a weight vector corresponding to the adaptive filter, T is a weight vector corresponding to the compensation filter, B is the blocking matrix, and x is the input signal.

7. The beam generator according to claim 6, wherein the weight vector corresponding to the adaptive filter is: $w_a = ((B \times T)^H R_{xx} \times B \times T)^{-1} \times (B \times T)^H \times R_{xx} w_q$, wherein $R_{xx}$ is an autocorrelation matrix of the input signal.

8. A beam generating method, comprising
filtering an input signal by a first-channel filter to obtain a first filtered signal, the first filtered signal comprising a desired signal;
blocking the desired signal in the input signal by a second-channel blocking module to obtain a blocked signal;
compensatively filtering the blocked signal by a compensation filter to obtain a second filtered signal;
adaptively filtering the second filtered signal by an adaptive filter to obtain a third filtered signal; and
merging the first filtered signal and the third filtered signal to obtain an output signal.

9. A chip, comprising a beam generator, wherein the beam generator comprises a first channel, a second channel, and a signal merging module, wherein:
the first channel comprises a first-channel filter, the first-channel filter filters an input signal to obtain a first filtered signal, and the first filtered signal comprises a desired signal;
the second channel comprises:
a second-channel blocking module for blocking the desired signal in the input signal to obtain a blocked signal,
a compensation filter, connected to the second-channel blocking module, for compensatively filtering the blocked signal to obtain a second filtered signal, and
an adaptive filter, connected to the compensation filter, for adaptively filtering the second filtered signal to obtain a third filtered signal;
wherein the signal merging module is connected to the first-channel filter and the adaptive filter for merging the first filtered signal and the third filtered signal to obtain an output signal.

* * * * *